US 11,171,644 B2

(12) United States Patent
Conte et al.

(10) Patent No.: US 11,171,644 B2
(45) Date of Patent: Nov. 9, 2021

(54) POWER-ON-RESET CIRCUIT AND CORRESPONDING ELECTRONIC DEVICE

(71) Applicants: STMicroelectronics S.r.l., Agrate Brianza (IT); STMicroelectronics (Rousset) SAS, Rousset (FR)

(72) Inventors: Antonino Conte, Tremestieri Etneo (IT); Francesco Tomaiuolo, Acireale (IT); Francesco La Rosa, Rousset (FR)

(73) Assignees: STMICROELECTRONICS S.R.L., Agrate Brianza (IT); STMICROELECTRONICS (ROUSSET) SAS, Rousset (FR)

( * ) Notice: Subject to any disclaimer, the term of this patent is extended or adjusted under 35 U.S.C. 154(b) by 0 days.

(21) Appl. No.: 17/207,382

(22) Filed: Mar. 19, 2021

(65) Prior Publication Data

US 2021/0297074 A1 Sep. 23, 2021

(30) Foreign Application Priority Data

Mar. 23, 2020 (IT) .................. 102020000006109

(51) Int. Cl.
*H03K 17/14* (2006.01)
*H03K 17/22* (2006.01)
(52) U.S. Cl.
CPC ......... *H03K 17/223* (2013.01); *H03K 17/145* (2013.01); *H03K 2017/226* (2013.01)
(58) Field of Classification Search
CPC ...... H03K 17/14; H03K 17/145; H03K 17/22; H03K 17/223; H03K 2017/226
USPC ................................................. 327/142, 143
See application file for complete search history.

(56) References Cited

U.S. PATENT DOCUMENTS

| 6,137,324 | A | 10/2000 | Chung |
| 7,612,588 | B2* | 11/2009 | Kimura ................ H03K 17/223 327/142 |
| 7,786,770 | B1* | 8/2010 | Liang ................. H03K 19/0016 327/143 |
| 9,882,558 | B1 | 1/2018 | Sun et al. |
| 2006/0132201 | A1 | 6/2006 | Barnett |
| 2007/0213946 | A1* | 9/2007 | Saether ............ G01R 19/16538 702/60 |

(Continued)

OTHER PUBLICATIONS

Pandey, P., "Low-Voltage power-on-reset circuit with least delay and high accuracy", Electronics Letters, May 28, 2015, vol. 51, N. 11, pp. 856-858.

*Primary Examiner* — William Hernandez
(74) *Attorney, Agent, or Firm* — Slater Matsil, LLP

(57) ABSTRACT

An embodiment power-on-reset circuit, having a power supply input to receive a power supply voltage, generates a reset signal with a value switching upon the power supply voltage crossing a POR detection level. The power-on-reset circuit has: a PTAT stage having a left branch and a right branch and generating a current equilibrium condition between the currents circulating in the left and right branches upon the power supply voltage reaching the POR detection level; and an output stage coupled to the PTAT stage and generating the reset signal, with the value switching at the occurrence of the current equilibrium condition for the PTAT stage. The power-on-reset circuit further comprises a detection-level generation stage, coupled to the PTAT stage as a central branch thereof to define the value of the POR detection level.

20 Claims, 3 Drawing Sheets

(56) References Cited

U.S. PATENT DOCUMENTS

| | | |
|---|---|---|
| 2008/0218223 A1 | 9/2008 | Kimura |
| 2009/0108887 A1* | 4/2009 | Du .......................... G06F 1/24 |
| | | 327/143 |
| 2010/0156477 A1 | 6/2010 | Chellappa |

* cited by examiner

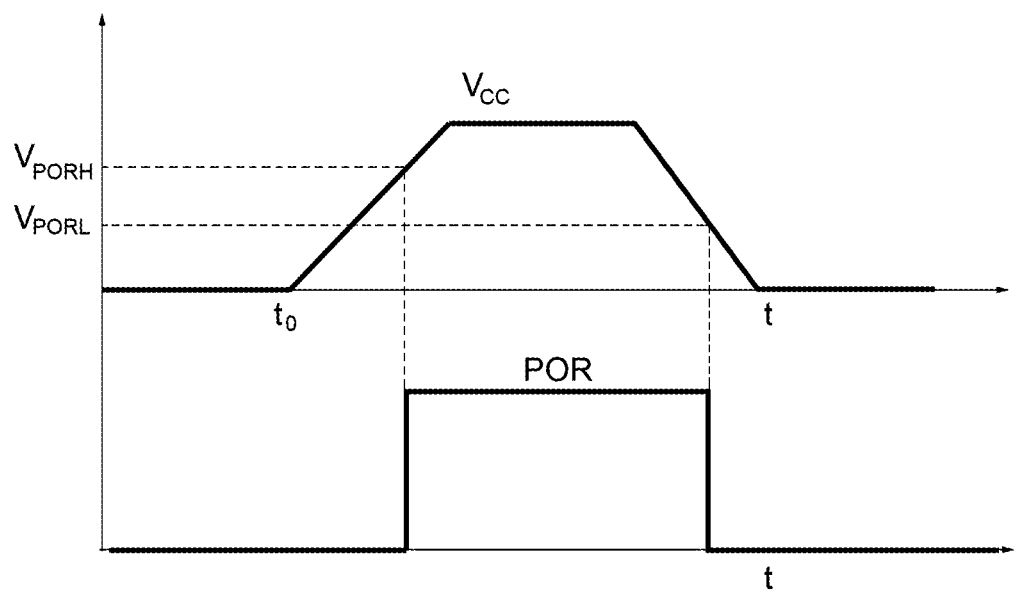
FIG.2A
FIG.2B
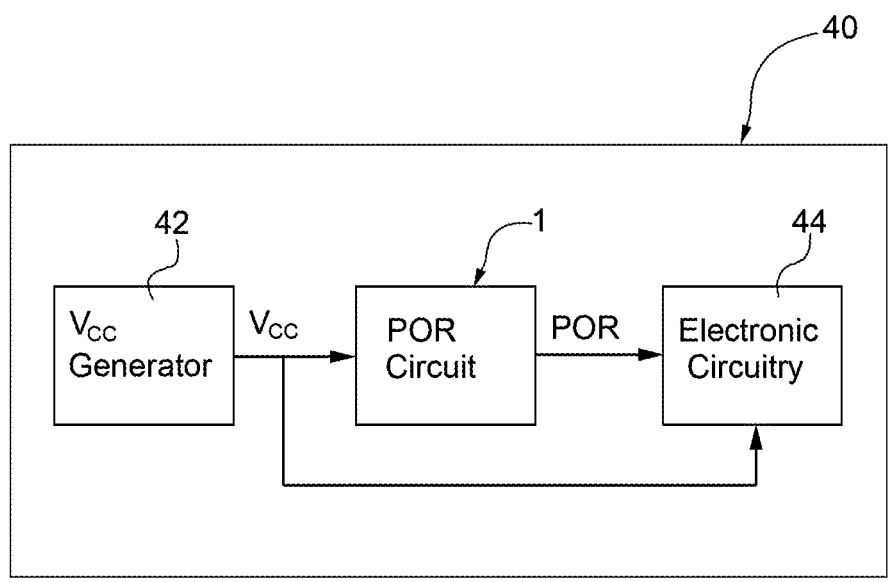
FIG.4

POWER-ON-RESET CIRCUIT AND CORRESPONDING ELECTRONIC DEVICE

CROSS-REFERENCE TO RELATED APPLICATIONS

This application claims the benefit of Italian Application No. 102020000006109, filed on Mar. 23, 2020, which application is hereby incorporated herein by reference.

TECHNICAL FIELD

The present solution relates to a power-on-reset circuit with improved electrical characteristics, and to a corresponding electronic device.

BACKGROUND

As it is known, a power-on-reset (POR) circuit is used in electronic devices, like stand-alone memories for consumer and industrial applications (e.g., flash memories) to provide a reset signal for device start-up, when the power supply reaches a suitably high detection level, so as to assure a correct power-on sequence. The same circuit is moreover configured to detect if the power supply drops below a certain low detection value (lower than the high detection level, so as to provide an adequate hysteresis), in order to stop any further circuit operation.

SUMMARY

Proper design of a POR circuit has to deal with several constraints related to both static and dynamic electrical performance. Moreover, in most of the cases, the environmental conditions where the POR circuit operates are complex due to a large variability of the power supply behavior (so-called extended power supply range).

Some desired electrical requirements for a POR circuit are generally the following: low dispersion of the high and low POR detection levels, in particular versus process and temperature variations; low static consumption, in particular versus positive temperature variations; noise immunity, in particular versus power-supply fast variations (for example, with respect to noise injected by I/O activity in case of use in memory electronic devices); and fast generation of the reset signal, in particular in case of fast power-supply ramps (for example with power supply ramping-up in a few µs).

POR circuits of a known type are generally based on dedicated band-gap voltage generators, with suitable additional logic circuits to control generation of the desired POR detection levels.

One example of such known circuits is disclosed in P. Pandey, "Low-Voltage power-on-reset circuit with least delay and high accuracy", Electronics Letters, 28 May 2015, Vol. 51 N. 11 p. 856-858.

The present Applicant, however, has realized that known solutions are not completely satisfactory, having some drawbacks and performance limitations, at least for certain applications.

In particular, it is generally difficult to generate reference voltages higher than the band-gap voltage (having, as it is known, values in the range of 1.25 V); power consumption may also be an issue, for example in case of portable applications where size and consumption are key design requirements, since a significant static consumption is generally required to activate the bandgap portion of the circuit; and time delays for the detection of the high and low detection levels of the power supply voltage may be too long (e.g., longer than tens of seconds) when compared to the time available for the complete power-on sequence of the associated electronic device (which may envisage for example configuration operations and the like).

The aim of embodiments of the present solution is to solve the problems previously highlighted and to provide an improved solution for a POR circuit, having improved electrical performances.

According to an embodiment of the present invention, a power-on-reset circuit and a corresponding electronic device are consequently provided, as defined in the appended claims.

BRIEF DESCRIPTION OF THE DRAWINGS

For a better understanding of the present invention, preferred embodiments thereof are now described, purely by way of non-limiting example and with reference to the attached drawings, wherein:

FIGS. 2A-2B show plots of a power supply provided to the circuit of FIG. 1 and of a POR signal generated at the output of the same circuit of FIG. 1;

FIG. 4 is a schematic block diagram of an electronic device, comprising the circuit of FIG. 1.

DETAILED DESCRIPTION OF ILLUSTRATIVE EMBODIMENTS

As will be discussed in detail in the following, an embodiment of the present solution provides a power-on-reset circuit based on a PTAT (Proportional To Absolute Temperature) stage, being configured to achieve POR detection levels higher than the bandgap voltage of silicon, envisaging minimum static power consumption and a high response speed.

The POR circuit may for example be used in stand-alone memory devices, such as Flash non-volatile memories.

Figure 1:
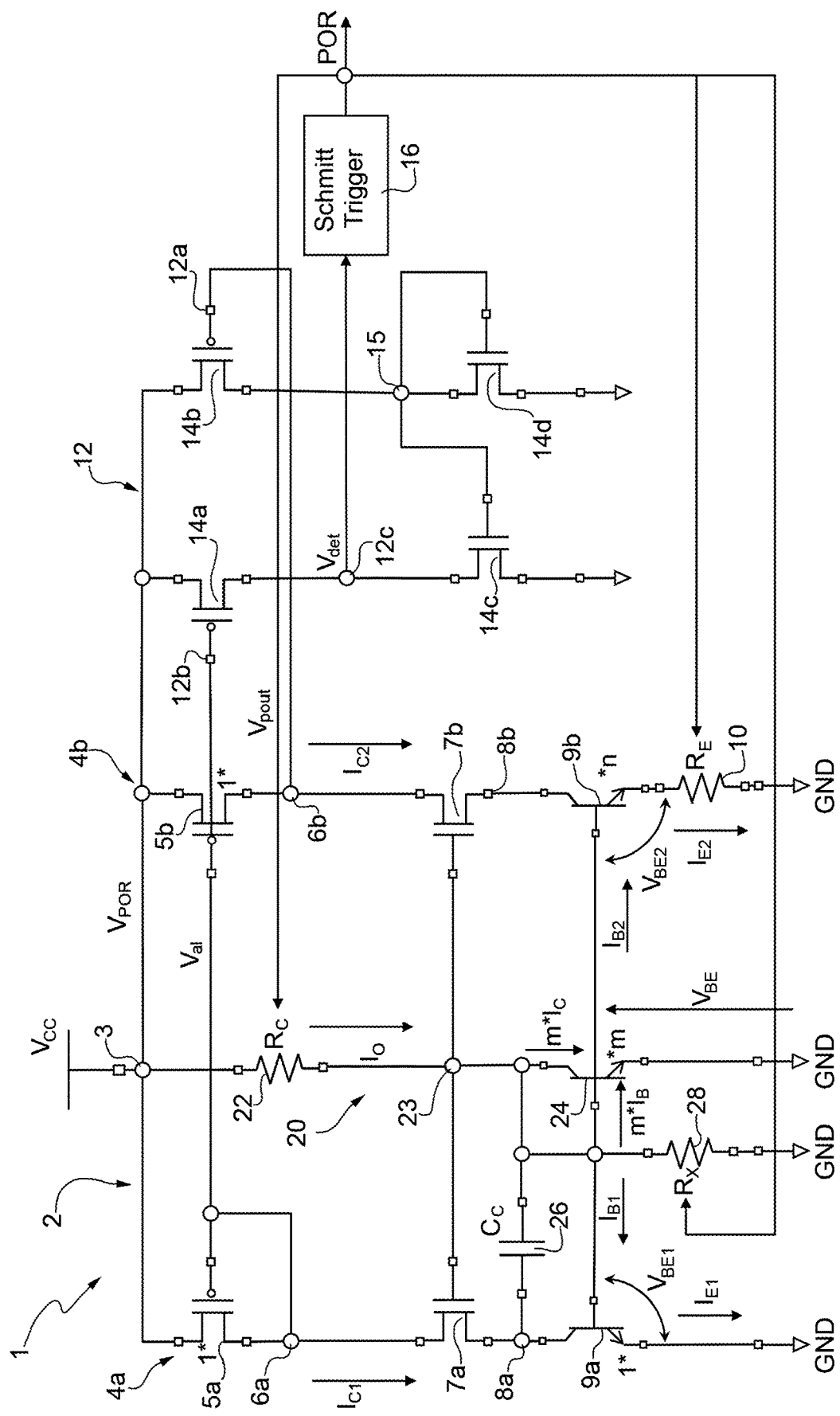
FIG. 1 shows a circuit diagram of a power-on-reset circuit, according to an embodiment of the present solution.

As shown in FIG. 1, the POR circuit, generally denoted with 1, comprises a PTAT generator stage 2, having a power supply input 3 coupled to a power supply unit (here not shown), providing a power supply voltage $V_{cc}$ having an extended range of variability (e.g., in the range comprised between 1.6 V and 3.6 V).

The PTAT stage 2 is based on the principle of equilibrium of currents between a left branch 4a and a right branch 4b thereof, the left branch 4a including: a current-mirror transistor 5a, of the PMOS type, coupled between the power supply input 3 and a first internal node 6a and arranged in a diode configuration, i.e. having the gate terminal coupled to the drain terminal thereof (both terminals being coupled to the first internal node 6a), wherein a left-branch current $I_{C1}$ flows through the current-mirror transistor 5a at the first internal node 6a; a cascode transistor 7a, of the NMOS type, coupled between the first internal node 6a and a second internal node 8a; and a load transistor 9a, of the bipolar type, coupled between the second internal node 8a and a reference terminal (in particular a ground terminal, GND).

The right branch 4b of the PTAT stage 2 includes: a respective current-mirror transistor 5b, of the PMOS type, coupled between the power supply input 3 and a respective first internal node 6b (representing an output node of the PTAT generator stage 2, providing a PTAT output voltage $V_{pout}$) and having the gate terminal coupled to the gate terminal of the current-mirror transistor 5a, wherein a right-branch current $I_{C2}$ flows through the current-mirror transistor 5b at the respective first internal node 6b; a respective cascode transistor 7b, of the NMOS type, coupled between the respective first internal node 6b and a respective second internal node 8b and having the gate terminal coupled to the gate terminal of the cascode transistor 7a; a respective load transistor 9b, of the bipolar type, having the collector terminal coupled to the respective second internal node 8b and having the base terminal coupled to the base terminal of load transistor 9a; and, moreover, a load resistor 10, having a resistance $R_E$, coupled between the emitter terminal of the load transistor 9b and the reference terminal GND.

In particular, load transistor 9b of the second branch 4b has a form-factor, which is n-times higher than that of load transistor 9a of the first branch 4a, with n higher than one (in a possible implementation, load transistor 9b is constituted by the parallel of n unitary transistors with same form factor as the load transistor 9a); a biasing voltage $V_{a1}$ is present at gate terminals of current-mirror transistors 5a, 5b; and a cascode voltage $V_c$ is present at gate terminals of the cascode transistors 7a, 7b.

The POR circuit 1 further comprises an output comparator 12, having: a first comparison input 12a, coupled to the output terminal of the PTAT stage 2 (i.e. to the respective first terminal 6b of the second branch 4b) and receiving the PTAT output voltage $V_{pout}$; a second comparison input 12b, coupled to the gate terminals of the current-mirror transistors 5a, 5b (i.e. to the first terminal 6a of the first branch 4a) and receiving the biasing voltage $V_{a1}$; and an output terminal 12C providing an output detection voltage $V_{det}$, dependent on the values of the PTAT output voltage $V_{pout}$ and the biasing voltage $V_{a1}$ (in particular on the difference thereof).

The output comparator 12 comprises: a first comparator transistor 14a, of the PMOS type, coupled between the power supply input 3 and the output terminal 12C and having gate terminal coupled to the second comparison input 12b and receiving the biasing voltage $V_{a1}$; a second comparator transistor 14b, of the PMOS type, coupled between the power supply input 3 and a comparator internal node 15 and having gate terminal coupled to the first comparison input 12a and receiving the PTAT output voltage $V_{pout}$; a third comparator transistor 14c, of the NMOS type, coupled between the output terminal 12C and the reference terminal GND, with gate terminal coupled to the comparator internal node 15; and a fourth comparator transistor 14d, of the NMOS type, coupled between the comparator internal node 15 and the reference terminal GND, with gate terminal coupled to the same comparator internal node 15 (the fourth comparator transistor 14d being arranged in a diode-configuration).

In the embodiment shown in FIG. 1, the POR circuit 1 moreover comprises an output Schmitt trigger 16, having an input coupled to the output terminal 12C of the output comparator 12 and receiving the output detection voltage $V_{det}$ and an output providing a reset signal POR, of a pulse type, switching between a first, e.g., low, to a second, e.g., high, value (the reset signal POR being provided, in a manner here not shown, to external circuitry of an associated electronic device, e.g., to perform operations according to a power-on sequence).

According to a particular aspect of the present solution, the POR circuit 1 further comprises a POR-detection-level generation branch, which constitutes a central branch for the above PTAT stage 2 (thus referred to in the following as central branch 20), between the left branch 4a and the right branch 4b.

In particular, the central branch 20 comprises: a central resistor 22, having resistance $R_C$, coupled between the power supply input 3 (and the collector terminals of the current-mirror transistors 5a, 5b) and a central node 23 (which is also coupled to the gate terminals of the cascode transistors 7a, 7b), with a central-branch current $I_O$ flowing through the central resistor 22; and a central transistor 24, of the bipolar type and in a diode-configuration (with base terminal connected to the collector terminal thereof), coupled in series to the central resistor 22, between the central node 23 and the reference terminal GND, having base terminal coupled to the respective base terminals of load transistors 9a, 9b of the left and right branches 4a, 4b.

In particular, central transistor 24 has a form-factor, which is m-times higher than that of load transistor 9a (with m higher than one); in a possible implementation, central transistor 24 is constituted by the parallel of m unitary transistors (with same form factor as the load transistor 9a).

The POR circuit 1 further comprises: a compensation capacitor 26, arranged between the second internal node 8a of the left branch 4a of the PTAT stage 2 and the central node 23 of central branch 20 (and the base terminals of load transistors 9a, 9b and central transistor 24); and, according to a particular aspect of the present solution, a current-injection resistor 28, with resistance $R_X$, coupled between the same central node 23 (and the base terminal of the central transistor 24) and the reference terminal GND, therefore being arranged in parallel to the base-emitter semiconductor junction of the central transistor 24.

According to a further aspect of the present solution, the load resistor 10, the central resistor 22 and the current-injection resistor 28 have respective resistance values $R_E$, $R_C$ and $R_X$, which are variable based on the value of the reset signal POR. In other words, switching of the value of the reset signal POR from a first (e.g., high) to a second (e.g., low) value determines switching of the resistance values $R_E$, $R_C$ and $R_X$ from a respective first value to a respective second value, different from the respective first value.

General operation of the POR circuit 1 envisages generation of the reset signal POR based on the current equilibrium condition of the PTAT stage 2, i.e. $I_{C1}=I_{C2}=I_C$ (in particular, switching of the same reset signal POR at the occurrence of the equilibrium condition), and definition of the desired high and low POR detection levels $V_{PORH}$, $V_{PORL}$ of the POR detection voltage $V_{POR}$ (both higher than the semiconductor bandgap voltage) exploiting the injection of a further current in the central branch 20 through the current-injection resistor 28, wherein the above current equilibrium condition is designed to occur when the power supply $V_{cc}$ crosses the high or low POR detection levels $V_{PORH}$, $V_{PORL}$.

Upon power-on, when the power supply voltage $V_{cc}$ starts to increase, as schematically shown in FIG. 2A at $t_o$, the central-branch current $I_O$ flowing through the central resistor 22 also starts increasing, as a function of the same power supply voltage $V_{cc}$, generating the base-emitter polarization $V_{BE}$ in the central transistor 24.

This increase continues until the detection point of the PTAT stage 2, when the current equilibrium condition $I_{c1}=I_{c2}=I_C$ occurs; at this moment, again due to the PTAT equilibrium condition, it is also verified the equilibrium of voltages at the first internal nodes 6a, 6b of the left and right branches 4a, 4b, i.e. $V_{a1}=V_{pout}$ (the biasing voltage $V_{a1}$ being substantially equal to the PTAT output voltage $V_{pout}$), causing the output detection voltage $V_{det}$ provided by the output comparator 12 to switch its value (for example, from a previous high value to a low value). This consequently triggers the output Schmitt trigger 16, which provides at the output the reset signal POR (as shown in FIG. 2B: in the example, the reset signal POR switches from a low to a high value, when the power supply voltage crosses the high POR detection level $V_{PORH}$).

Triggering of the reset signal POR also causes switching of the resistance values $R_E$, $R_C$ and $R_X$ of the load resistor 10, the central resistor 22 and the current-injection resistor 28 from the respective first value to the respective second value, determining a corresponding shift of the POR detection level to the low level $V_{PORL}$. It is therefore underlined that, when the reset signal POR has yet to switch, the above resistances are sized to achieve the high POR detection level $V_{PORH}$ and when the reset signal POR has already switched, the same resistances are set to achieve the low POR detection level $V_{PORL}$.

Afterwards (and again as shown in FIGS. 2A, 2B), only when the power supply voltage $V_{cc}$ moves below the same low POR detection level $V_{PORL}$, the output detection voltage $V_{det}$ provided by the output comparator 12 switches again its value (in particular, from the previous low value to the high value) consequently triggering the output Schmitt trigger 16 and causing the reset signal POR to switch back to the low level.

It is noted that hysteresis on the POR detection level is generated always assuring temperature compensation, i.e. the high and low POR detection levels $V_{PORH}$ and $V_{PORL}$ are both compensated in temperature (both being based on the PTAT equilibrium condition of the PTAT stage 2).

It is furthermore noted that the role of cascode transistors 7a, 7b is to increase the comparator gain, the cascode operation allowing generation of well defined threshold points for POR detection.

Moreover, compensation capacitor 26 allows balancing the Miller effect at the start of the operation; in particular, during ramp-up of power supply voltage $V_{cc}$, the presence of the compensation capacitor 26 guarantees a systematic high value for the POR detection level (and thus a secure commutation of the POR detection level for any $V_{cc}$ slope).

A more detailed disclosure of the operation of the POR circuit 1 is now presented, first considering basic known bipolar equations for the bipolar transistors:

$$I_C = \beta_F \cdot I_B;$$

$$I_E = I_C \cdot \frac{\beta_F}{1 + \beta_F};$$

$$I_C = I_S \cdot e^{\frac{V_{BE}}{V_T}}, \quad I_S \sim A_E(\text{emitter area});$$

$$V_T = \frac{K \cdot T}{q} \approx 25 \text{ mV at } 25° \text{ C.}$$

The POR detection voltage $V_{POR}$, i.e. the voltage at the the power supply input 3, can be expressed as:

$$V_{POR} = I_O \cdot R_C + V_{BE} \quad (1)$$

considering the voltage drop on the central resistor 22 due to the central-branch current $I_O$ and also the base emitter voltage $V_{BE}$ of the central transistor 24 (it is noted that most of the consumption of the POR circuit 1 is conveyed in the central branch 20, due to the same central-branch current $I_O$).

Considering the currents at central node 23 and that the equilibrium condition $I_{C1}=I_{C2}=I_C$ ($I_C$ being the equilibrium current) is equivalent to $I_{B1}=I_{B2}=I_B$ (where $I_{B1}$ and $I_{B2}$ are the base currents of load transistors 9a, 9b, which therefore operate base on a same base current), it may be shown that:

$$I_O = m \cdot I_C + (m+2) \cdot I_B + \frac{V_{BE}}{R_x} \rightarrow I_O = I_C \cdot B + \frac{V_{BE}}{R_x} \quad (2)$$

wherein:

$$B = \left(m + \frac{m+2}{\beta_F}\right) \quad (3)$$

Central-branch current $I_O$ therefore is given by the sum of two factors, one due to the equilibrium current $I_C$ (which is a function of the power supply voltage $V_{cc}$) and the other due to the further current injected through the current-injection resistor 28.

Accordingly, the above expression (i) can be rewritten as:

$$V_{POR} = \left(I_C \cdot B + \frac{V_{BE}}{R_x}\right) \cdot R_C + V_{BE} \quad (4)$$

Moreover, from the PTAT equilibrium condition it follows that:

$$I_C = \frac{V_{BE1} - V_{BE2}}{R_E} = \frac{\Delta V_{BE}}{R_E} = \frac{V_T}{R_E} \cdot \left(\ln\frac{I_{S2}}{I_{S1}}\right) = \frac{V_T}{R_E} \cdot \ln n \quad (5)$$

(where $V_{BE1}$ and $V_{BE}$ are the respective base-emitter voltages of load transistors 9a, 9b and $\Delta V_{BE}$ the difference between the same respective base-emitter voltages).

Setting M=ln n, it follows that:

$$I_C = \frac{V_T}{R_E} \cdot M \quad (6)$$

and therefore, rewriting expression (4):

$$V_{POR} = V_T \cdot \frac{R_C}{R_E} \cdot M \cdot B + V_{BE} \cdot \left(\frac{R_C}{R_X} + 1\right) \quad (7)$$

From the above expression (7) it is clear that the $V_{BE}$ value (i.e. the bandgap voltage of the semiconductor material ~1.25 V) is amplified by a resistive ratio ($R_C/R_X+1$), allowing POR detection values above the bandgap voltage to be obtained (which are dependent on the resistance values $R_E$, $R_C$ and $R_X$ of the load resistor 10, the central resistor 22 and the current-injection resistor 28).

It is again noted that the POR detection level shift above the bandgap voltage is obtained thanks to the injection of the current $V_{BE}/R_X$ in the central resistor 22 (via the current-injection resistor 28); moreover, from the above expression (7), it is clear that the two components associated with $V_T$ (the thermal voltage) and $V_{BE}$ (the base emitter voltage) can be combined through independent coefficients, thanks to the presence of the same current-injection resistor 28, in order to jointly provide the POR detection voltage $V_{POR}$.

A condition of independency from temperature ($\partial V_{POR}/\partial T=0$) may now be imposed in expression (7), also considering the following expressions:

$$V_T = \frac{K \cdot T}{q} = h \cdot T, \text{ with } h \sim 0.087 \text{ mV}/°K$$

$$\frac{\partial V_{BE}}{\partial T} = -2 \text{ mV}/°K = b$$

Starting from the above expression (7) and considering the hypothesis $\partial B/\partial T \sim 0$, the following is obtained:

$$\frac{\partial V_{POR}}{\partial T} = h \cdot \frac{R_C}{R_E} \cdot M \cdot B + \left(\frac{R_C}{R_X} + 1\right) \cdot b = 0 \quad (8)$$

$$\left(\frac{R_C}{R_X} + 1\right) = -\frac{h \cdot M \cdot B}{b} \cdot \frac{R_C}{R_E}$$

This expression (8) may be replaced in the above expression (7), obtaining:

$$V_{POR} = \quad (9)$$

$$V_T \cdot \frac{R_C}{R_E} \cdot M \cdot B - V_{BE} \cdot \frac{h \cdot M \cdot B}{b} \cdot \frac{R_C}{R_E} = \frac{R_C}{R_E} \cdot M \cdot B\left(V_T - V_{BE} \cdot \frac{h}{b}\right)$$

and thus:

$$\frac{R_C}{R_E} \cdot M \cdot B = \frac{V_{POR}}{\left(V_T - V_{BE} \cdot \frac{h}{b}\right)} \quad (10)$$

As will be discussed in the following, the above expression (10) may be used for designing the POR circuit (1) and in particular, for determining the $R_C/R_E$ resistance ratio value, also taking into account the consumption of the POR circuit 1.

Combining above expressions (8) and (10), it also follows:

$$\left(\frac{R_C}{R_X} + 1\right) = \frac{V_{POR}}{\left(-V_T \cdot \frac{b}{h} + V_{BE}\right)} \quad (11)$$

from which it is clear that the ratio $R_C/R_x$ is determined by the value of the POR detection levels.

Further design considerations derive from the power consumption of the POR circuit 1.

In this regard, it is noted that the static consumption IT at the switching point is determined by summing the currents in the three branches of the POR circuit 1 (left branch 4a, central branch 22 and right branch 4b):

$$I_T = I_0 + 2 \cdot I_C = (B+2) \cdot I_C B$$

so that:

$$B = \frac{I_T}{I_C} - 2 \quad (12)$$

The selection of parameter B (and so of m, see above expression 3) is thus strictly related with the global static consumption IT.

In particular, selection of parameter m is linked with two contrasting requirements: the speed of the POR detection versus the global consumption (the lower m, the higher the speed at the switching point due to a higher current circulating in the left and right branches 4a, 4b); the positive slope compensation of the POR detection level versus temperature (the higher m, the lower the positive compensation coefficient in the above expression (9) for the POR detection level).

When the power supply voltage $V_{cc}$ is well above the POR switching point (i.e. well above the high POR detection level $V_{PORH}$), the current consumption $I_{CC}$ is mostly determined by the central resistor 22 and the left branch 4a of the PTAT stage 2 with the load transistor 9a (the right branch 4b is instead limited in current and its contribution can thus be neglected); moreover, the output comparator 12 (with comparator transistors 14a-14d) is in this case off, with no current flowing through the same transistors.

As an approximation, the following expression applies for current consumption $I_{CC}$, in this operating phase:

$$I_{CC} \sim \frac{(V_{CC} - V_{BE})}{R_C} \cdot \frac{m+1}{m} \quad (13)$$

Selection of M (and consequently n, being M=ln n) takes into account area occupation, due to the size of load resistor 10 with resistance $R_E$, and circuit speed, since higher M means higher n (i.e. a higher number of bipolar transistors in parallel in load transistor 9b). On the other hand, M cannot be too much low, otherwise it is difficult to balance the negative slope in the above expression (9) for the POR detection level; for example, n=4 can be a starting point for designing the POR circuit 1.

The value and size of central resistor 22 is basically determined by the target current consumption $I_{CC}$, according to formula (13) for the same current consumption $I_{CC}$.

After the selection of n, m and $R_C$, all the other parameters are determined accordingly: in particular, resistance $R_E$ can be deduced from above expression (10); resistance $R_x$ can be deduced from the above expression (11).

It is underlined that two different and distinct values for resistances $R_C$, $R_E$, and $R_X$ are determined, one for each of the high and low POR detection levels ($V_{PORH}$ and $V_{PORL}$).

In particular, it is noted that proper choice of the resistance values allows to achieve a high response speed at the high POR detection level $V_{PORH}$ (in particular with a lower value for resistances $R_E$ and $R_C$ and a higher current circulating in the circuit branches), when a high reactivity is needed to start the power-on sequence; and a lower consumption (with a corresponding lower reactivity, but this is not an issue for the correct operation of the circuit and the associated electronic device) at the low POR detection level $V_{PORL}$ (in particular with a higher value for resistances $R_E$ and $R_C$, when the consumption is induced by the value of $R_C$, as seen above for expression (13)).

Figure 3:
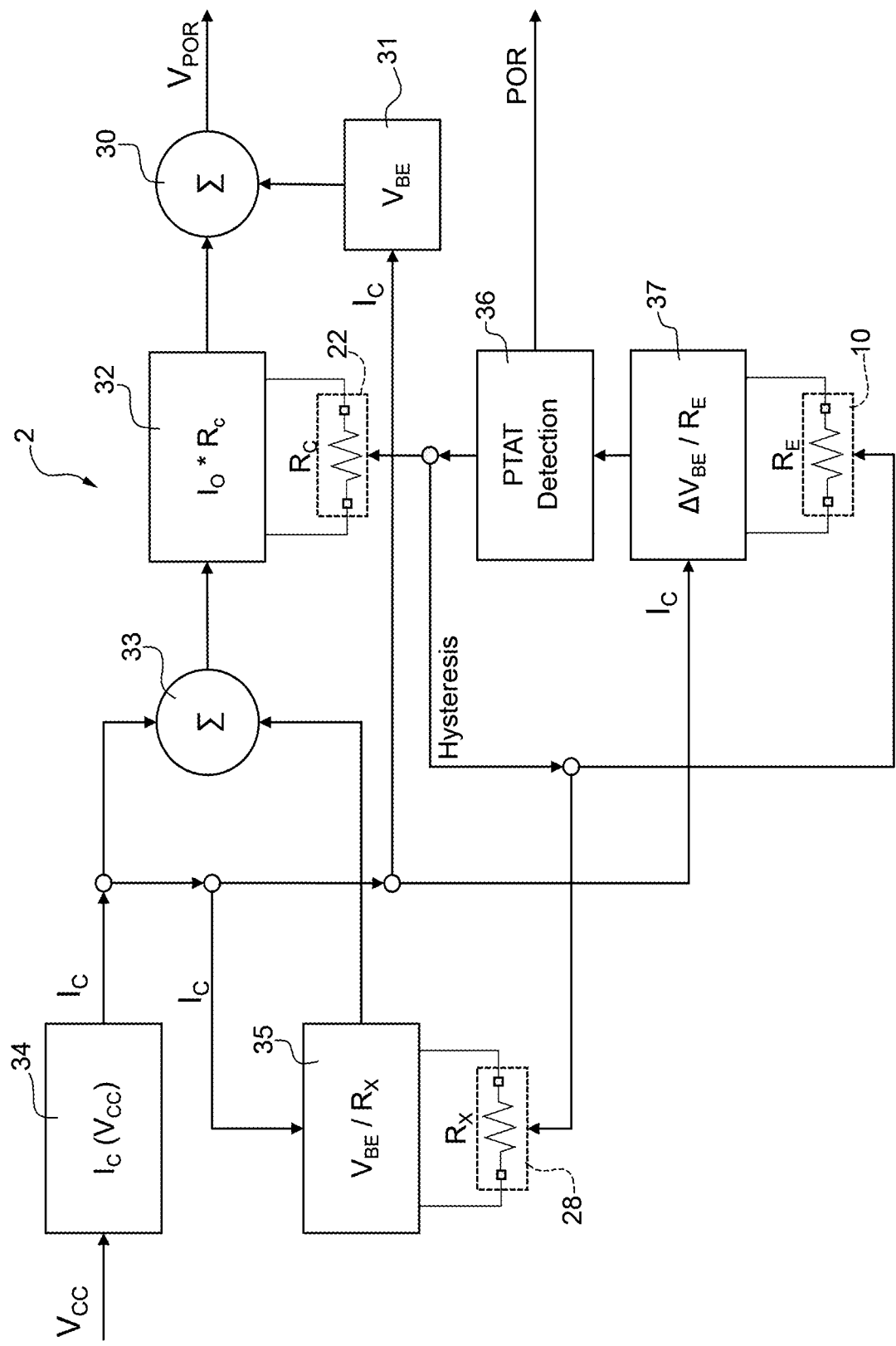
FIG. 3 is a schematic block diagram of the POR circuit 1 of FIG. 1.

FIG. 3 shows a schematic block diagram representative of the general operation of the POR circuit 1, as discussed above (it is noted that in this diagram base currents in the load transistors 9a, 9b and central transistor 24 are not considered, for sake of simplicity).

In particular, as shown at block 30, POR detection voltage $V_{POR}$ (at the high or low POR detection level $V_{PORH}$, $V_{PORL}$) is generated as the sum of the base-emitter voltage $V_{BE}$ in the central transistor 24 (block 31) and the voltage drop ($I_o$–$R_c$) on the central resistor 22 (block 32), due to the central-branch current $I_O$.

As shown at block 33, the central-branch current $I_O$ is given by the sum of the equilibrium current $I_C$, which is a function of the power supply voltage $V_{cc}$ (block 34), and of the further current $V_{BE}/R_x$ injected via the current-injection resistor 28 (block 35).

Moreover, at block 36, the current equilibrium detection condition of the PTAT stage 2 is shown, with equal currents $I_{C1}=I_{C2}=I_C$ (the equilibrium current $I_C$ being given by $\Delta V_{BE}/R_E$ as shown in block 37) circulating in the left and right branches 4a, 4b, upon the power supply voltage $V_{cc}$ crossing the POR detection voltage $V_{POR}$; PTAT detection causes switching of the reset signal POR at the output.

As shown in the same FIG. 3, hysteresis in the POR detection is achieved by modification, at the equilibrium condition of the PTAT stage 2, of the resistance values values $R_E$, $R_C$ and $R_X$ of load resistor 10, central resistor 22 and current-injection resistor 28.

FIG. 4 schematically shows an electronic device 40, e.g., a stand-alone non-volatile memory device (such as a Flash memory), including a power supply generator 42, providing the power supply $V_{CC}$; the disclosed POR circuit 1, receiving the power supply $V_{CC}$ and configured to generate the reset signal POR based on the value of the same power supply $V_{CC}$ crossing the high and low POR detection levels $V_{PORH}$, $V_{PORL}$; and electronic circuitry 44, coupled to the POR circuit 1 to receive the reset signal POR, in order to activate a power-on sequence of operations (when the same reset signal POR switches to a first value, e.g., a high value) or to stop operations (when the reset signal POR switches to a second value, e.g., a low value).

The advantages of the proposed solution are clear from the foregoing description.

In any case, it is again underlined that the proposed solution allows to achieve the following advantages versus known solutions: a full control in temperature for both POR detection thresholds (high and low POR detection levels $V_{PORH}$, $V_{PORL}$); a very low consumption in all operating conditions; a high speed at the $V_{PORH}$ threshold; a high noise immunity; the possibility to finely tune the high and low POR detection levels $V_{PORH}$, $V_{PORL}$ at any desired level above the bandgap level.

Moreover, as previously underlined, the speed of POR answer during $V_{PORH}$ transition is not limited by the consumption; this allows to increase the consumption above the static target before crossing of the high POR detection level $V_{PORH}$ and to achieve good speed performances even for very high $V_{CC}$ slopes.

Simulations and tests made by the present Applicant have shown the possibility for the disclosed POR circuit 1 to achieve improved electrical performances, both for static and dynamic operations.

In particular, static performance includes: a high hysteresis range of about ~70 mV between the high and low POR detection levels; immunity to disturbs during slow $V_{CC}$ slopes; high and low POR detection levels compensated in a wide temperature range (e.g., from −40° C. to 125° C.), with minimum variations (e.g., lower than 10 mV) in the whole temperature range, and tunable above the bandgap native voltage (~1.25V), for example with values of $V_{PORH}$~1.42V, $V_{PORL}$~1.35V; low sensitivity to (global and/or mismatch) process variation, for example $V_{PORL}$~1.35+/−100 mV (at 3σ); low static consumption, for example $I_{CC}$<1 µA in worst case conditions (with a power supply voltage $V_{CC}$ of 1.8V, T=150° C., +/−3G) and $I_{cc}$<2 µA in worst case conditions (with a power supply voltage $V_{CC}$ of 3.6V, T=150° C., +/−3σ).

Dynamic performance includes: $T_{PORH}$<4 µs in a worst case condition ($T_{PORH}$ being the delay in the reset signal POR switching with respect to the power supply $V_{CC}$ crossing the high POR detection level $V_{PORH}$); $T_{PORL}$<10 µs in a worst case condition ($T_{PORL}$ being the delay in the reset signal POR switching with respect to the power supply $V_{CC}$ crossing the low POR detection level $V_{PORL}$); immunity to $V_{CC}$ spikes induced by I/O commutation.

Finally, it is clear that modifications and variations may be made to what has been described and illustrated herein, without thereby departing from the scope of the present invention, as defined in the annexed claims.

In particular, it is noted that the POR circuit 1 may not include the output Schmitt trigger 16, coupled to the output comparator 12 (in this case, the output of the same output comparator 12 providing the reset signal POR).

Moreover, it is again underlined that the disclosed POR circuit 1 may be used advantageously in any kind of electronic device, wherein a reset signal is required for device start-up, when the power supply reaches a suitable high threshold, and for device deactivation, when the power supply drops below a certain low threshold.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A power-on-reset (POR) circuit, comprising:
    a power supply input configured to receive a power supply voltage;
    a proportional to absolute temperature (PTAT) stage having a left branch and a right branch and configured to generate a current equilibrium condition between currents circulating in the left and right branches upon the power supply voltage reaching a POR detection level;
    an output stage, coupled to the PTAT stage and configured to generate a reset signal with a value switching at an occurrence of the current equilibrium condition for the PTAT stage; and
    a detection-level generation stage, coupled to the PTAT stage as a central branch thereof and configured to define the value of the POR detection level.

2. The POR circuit according to claim 1, wherein the detection-level generation stage is configured to generate the value of the POR detection level, switching between a high and a low level, both higher than a bandgap reference voltage, upon switching of the reset signal.

3. The POR circuit according to claim 1,
    wherein the detection-level generation stage comprises a central resistor element coupled between the power supply input and a central node, a semiconductor-junction element coupled in series to the central resistor element and a current-injection resistor element coupled in parallel to the semiconductor-junction element so that, during operation, a semiconductor junction voltage is applied thereon; and
    wherein the detection-level generation stage is configured to define the value of the POR detection level based on a voltage drop on the central resistor element due to a sum of an equilibrium current in the left and right branches of the PTAT stage at the current equilibrium condition and of a further current configured to be injected in the central resistor element through the current-injection resistor element.

4. The POR circuit according to claim 3, wherein the detection-level generation stage is configured to define the value of the POR detection level as a sum of the voltage drop on the central resistor element and of the semiconductor junction voltage.

5. The POR circuit according to claim 3, wherein the central resistor element and the current-injection resistor element have respective resistance values that are variable based on the value of the reset signal, and wherein switching of the value of the reset signal determines switching of the resistance values of the central resistor element and the current-injection resistor element from a respective first value to a respective second value, different from the respective first value.

6. The POR circuit according to claim 3,
wherein the left branch of the PTAT stage comprises:
 a first current-mirror transistor, coupled between the power supply input and a first internal node and arranged in a diode configuration, wherein a left-branch current flows through the first current-mirror transistor at the first internal node; and
 a bipolar load transistor coupled between the first internal node and a reference terminal; and
wherein the right branch of the PTAT stage comprises:
 a respective current-mirror transistor, coupled between the power supply input and a respective first internal node and having a gate terminal coupled to a gate terminal of the first current-mirror transistor, wherein a right-branch current flows through the respective current-mirror transistor at the respective first internal node; and
 a bipolar respective load transistor having a collector terminal coupled to the respective first internal node, a base terminal coupled to a base terminal of the load transistor of the left branch, and an emitter terminal coupled to the reference terminal through a load resistor element;
 wherein the respective load transistor of the right branch has a form-factor that is n-times higher than that of the load transistor of the left branch, with n being higher than one.

7. The POR circuit according to claim 6, wherein the semiconductor-junction element of the detection-level generation stage is a bipolar transistor element in a diode-configuration having a collector terminal coupled to the central resistor element and a base terminal coupled to the current-injection resistor element and to the base terminals of the load transistors of the left and right branches; and
 wherein the semiconductor junction voltage is the voltage drop between the base and emitter terminals of the bipolar transistor element and the further current configured to be injected in the central resistor element through the current-injection resistor element is given by $V_{BE}/R_x$, where $V_{BE}$ is the semiconductor junction voltage and $R_x$ the resistance value of the current-injection resistor element.

8. The POR circuit according to claim 7, wherein the bipolar transistor element of the detection-level generation stage has a respective form-factor that is m-times higher than that of the load transistor of the left branch, with m being higher than one.

9. The POR circuit according to claim 6, wherein the load resistor element has a respective resistance value which is variable based on the value of the reset signal, and wherein switching of the value of the reset signal determines switching of the resistance value of the load resistor element from a respective first value to a respective second value, different from the respective first value.

10. The POR circuit according to claim 6, wherein the PTAT stage further comprises a compensation capacitor coupled between a collector terminal of the load transistor of the left branch and the central node of the detection-level generation stage.

11. The POR circuit according to claim 6, wherein the PTAT stage comprises, both in the left branch and in the right branch, a respective cascode transistor, coupled between the respective first internal node and the collector terminal of the respective load transistor, wherein the cascode transistors have gate terminals coupled together and to the central node of the detection-level generation stage.

12. The POR circuit according to claim 6, wherein the output stage comprises a comparator unit having a first comparison input coupled to the right branch of the PTAT stage and configured to receive a right-branch voltage and a second comparison input coupled to the left branch of the PTAT stage and configured to receive a left-branch voltage; and wherein the left-branch voltage and the right-branch voltage are configured to have a same value at the current equilibrium condition of the PTAT stage.

13. The POR circuit according to claim 12,
wherein the gate terminal of the respective current-mirror transistor of the right branch of the PTAT stage is configured to receive a biasing voltage; and
wherein the second comparison input of the comparator unit is coupled to the first internal node of the left branch of the PTAT stage to receive the biasing voltage as the left-branch voltage, and the first comparison input of the comparator unit is coupled to the first internal node of the right branch of the PTAT stage to receive a PTAT output voltage as the right-branch voltage.

14. The POR circuit according to claim 12, wherein the output stage further comprises a Schmitt trigger unit coupled at an output terminal of the comparator unit and configured to provide the reset signal as a function of an output voltage of the comparator unit.

15. The POR circuit according to claim 12, wherein the comparator unit comprises:
 a PMOS first comparator transistor coupled between the power supply input and an output terminal and having a gate terminal coupled to the second comparison input;
 a PMOS second comparator transistor coupled between the power supply input and a comparator internal node and having a gate terminal coupled to the first comparison input;
 an NMOS third comparator transistor coupled between the output terminal and the reference terminal, with a gate terminal coupled to the comparator internal node; and
 an NMOS fourth comparator transistor coupled between the comparator internal node and the reference terminal, with a gate terminal coupled to the same comparator internal node, thus being arranged in a diode-configuration.

16. An electronic device comprising:
 a power supply generator configured to provide a power supply voltage;
 a power-on-reset (POR) circuit comprising:
  a power supply input configured to receive the power supply voltage;

a proportional to absolute temperature (PTAT) stage having a left branch and a right branch and configured to generate a current equilibrium condition between currents circulating in the left and right branches upon the power supply voltage reaching a POR detection level;

an output stage, coupled to the PTAT stage and configured to generate a reset signal with a value switching at an occurrence of the current equilibrium condition for the PTAT stage; and a detection-level generation stage, coupled to the PTAT stage as a central branch thereof and configured to define the value of the POR detection level; and electronic circuitry, coupled to the POR circuit and configured to:

receive the reset signal;

activate a power-on sequence of operations when the reset signal switches to a first value; and stop operations when the reset signal switches to a second value.

17. The electronic device according to claim 16, wherein the electronic device is a stand-alone memory device.

18. The electronic device according to claim 16, wherein the detection-level generation stage is configured to generate the value of the POR detection level, switching between a high and a low level, both higher than a bandgap reference voltage, upon switching of the reset signal.

19. The electronic device according to claim 16, wherein the detection-level generation stage comprises a central resistor element coupled between the power supply input and a central node, a semiconductor-junction element coupled in series to the central resistor element and a current-injection resistor element coupled in parallel to the semiconductor-junction element so that, during operation, a semiconductor junction voltage is applied thereon; and wherein the detection-level generation stage is configured to define the value of the POR detection level based on a voltage drop on the central resistor element due to a sum of an equilibrium current in the left and right branches of the PTAT stage at the current equilibrium condition and of a further current configured to be injected in the central resistor element through the current-injection resistor element.

20. The electronic device according to claim 19, wherein the left branch of the PTAT stage comprises:

a first current-mirror transistor, coupled between the power supply input and a first internal node and arranged in a diode configuration, wherein a left-branch current flows through the first current-mirror transistor at the first internal node; and a bipolar load transistor coupled between the first internal node and a reference terminal; and wherein the right branch of the PTAT stage comprises:

a respective current-mirror transistor, coupled between the power supply input and a respective first internal node and having a gate terminal coupled to a gate terminal of the first current-mirror transistor, wherein a right-branch current flows through the respective current-mirror transistor at the respective first internal node; and a bipolar respective load transistor having a collector terminal coupled to the respective first internal node, a base terminal coupled to a base terminal of the load transistor of the left branch, and an emitter terminal coupled to the reference terminal through a load resistor element;

wherein the respective load transistor of the right branch has a form-factor that is n-times higher than that of the load transistor of the left branch, with n being higher than one.

* * * * *